(12) United States Patent
Anthofer et al.

(10) Patent No.: US 6,597,053 B1
(45) Date of Patent: Jul. 22, 2003

(54) INTEGRATED CIRCUIT ARRANGEMENT WITH A NUMBER OF STRUCTURAL ELEMENTS AND METHOD FOR THE PRODUCTION THEREOF

(75) Inventors: Anton Anthofer, Freihung (DE); Holger Hübner, Baldham (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/403,157

(22) PCT Filed: Mar. 13, 1998

(86) PCT No.: PCT/DE98/00769
§ 371 (c)(1),
(2), (4) Date: Oct. 15, 1999

(87) PCT Pub. No.: WO98/48459
PCT Pub. Date: Oct. 29, 1998

(51) Int. Cl.[7] ............ H01L 31/113; H01L 31/119; H01L 23/552; H01L 21/331; H01P 3/08
(52) U.S. Cl. ............ 257/508; 257/374; 257/659; 257/630; 257/500; 257/294; 257/275; 257/340; 257/228; 257/244; 438/348; 438/361; 438/272; 438/152; 361/800; 361/824; 333/246; 333/247
(58) Field of Search ............ 257/508, 374, 257/659, 630, 500, 294, 275, 340, 278, 244; 361/800, 824; 438/348, 361, 272, 152; 333/242, 246

(56) References Cited

U.S. PATENT DOCUMENTS

| | | | |
|---|---|---|---|
| 4,617,193 A | | 10/1986 | Wu |
| 4,839,309 A | | 6/1989 | Easter et al. |
| 5,122,856 A | * | 6/1992 | Komiya ............ 357/55 |
| 5,266,511 A | | 11/1993 | Takao |
| 5,306,942 A | * | 4/1994 | Fuji ............ 257/508 |
| 5,440,510 A | * | 8/1995 | Caprara et al. ............ 365/185 |
| 5,502,431 A | | 3/1996 | Usui |
| 5,969,378 A | * | 10/1999 | Singh ............ 257/77 |
| 6,022,787 A | * | 2/2000 | Ma ............ 438/422 |
| 6,090,647 A | * | 7/2000 | Grass ............ 438/151 |
| 6,133,116 A | * | 10/2000 | Kim et al. ............ 438/430 |

FOREIGN PATENT DOCUMENTS

| | | |
|---|---|---|
| EP | 0 567 694 A1 | 11/1993 |
| JP | 61-290753 | 12/1986 |
| JP | 62 254459 | 6/1987 |
| JP | 06 164088 | 6/1994 |

OTHER PUBLICATIONS

A. Nakagawa, et al., "New 500V Output Device Structures for Thin Silicon Layer on Silicon Dioxide Film", Proceedings of the 1990 International Symposium on Power Semiconductor Devices & ICS, Tokyo, 1990, p. 97.

* cited by examiner

Primary Examiner—David L. Talbott
Assistant Examiner—James Mitchell
(74) Attorney, Agent, or Firm—Schiff Hardin & Waite

(57) ABSTRACT

An integrated circuit arrangement having a number of structural elements, at least one of which is surrounded by a metallic shielding structure. This structural element is thus protected against interference due to disturbing impulses from its environment. In particular, the structural elements of the circuit arrangement can be arranged next to or on top of one another. To produce the metallic shielding structure of a structural element of the circuit arrangement, at least one depression which surrounds the structural element is created and then lined with metal. The contacts and electrical connections of the structural element are electrically insulated from the metal of the shielding structure. To connect two structural elements within a three-dimensional circuit arrangement, the surfaces of the structural elements that face one another can be covered with two different metals, the alloy thereof having a melting point $T_S$ above the melting point $T_1$ of at least one of the metals, so that heating to a temperature between the two melting points results in a permanent connection.

20 Claims, 3 Drawing Sheets

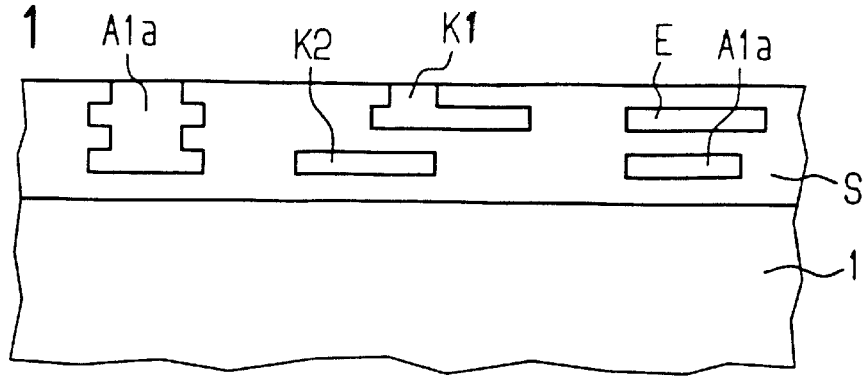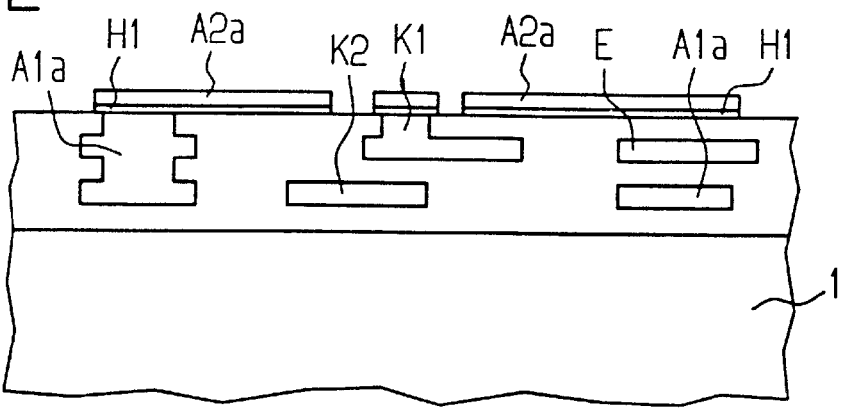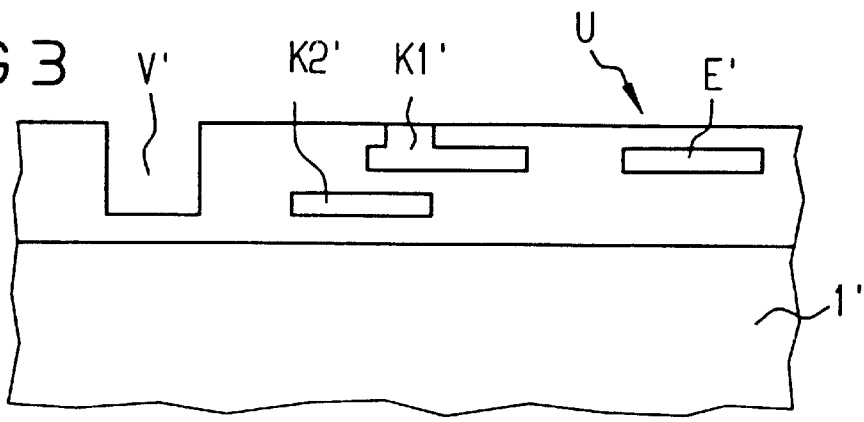

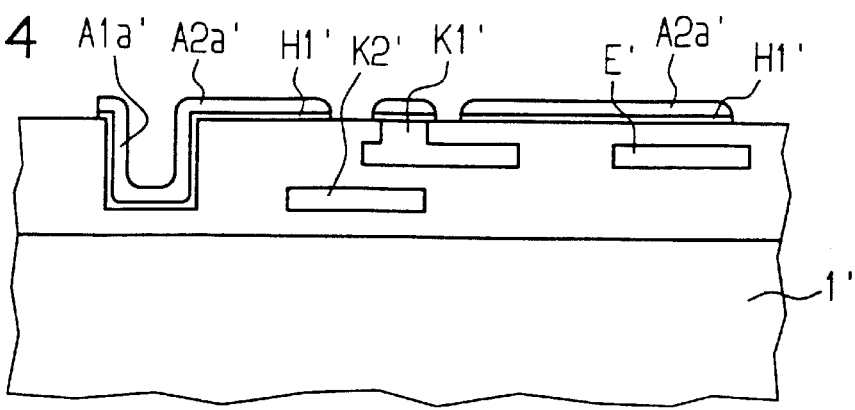
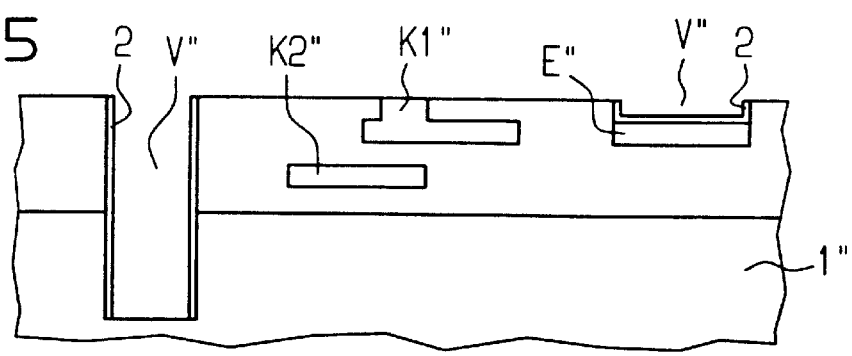
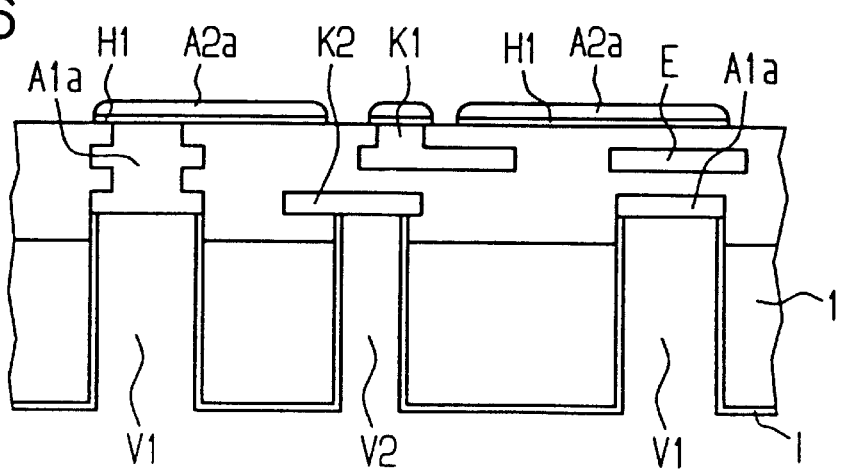

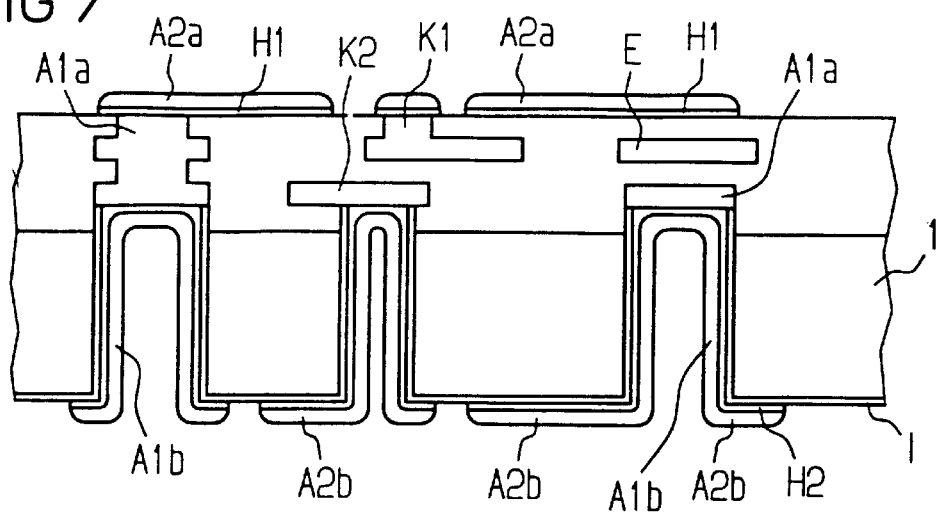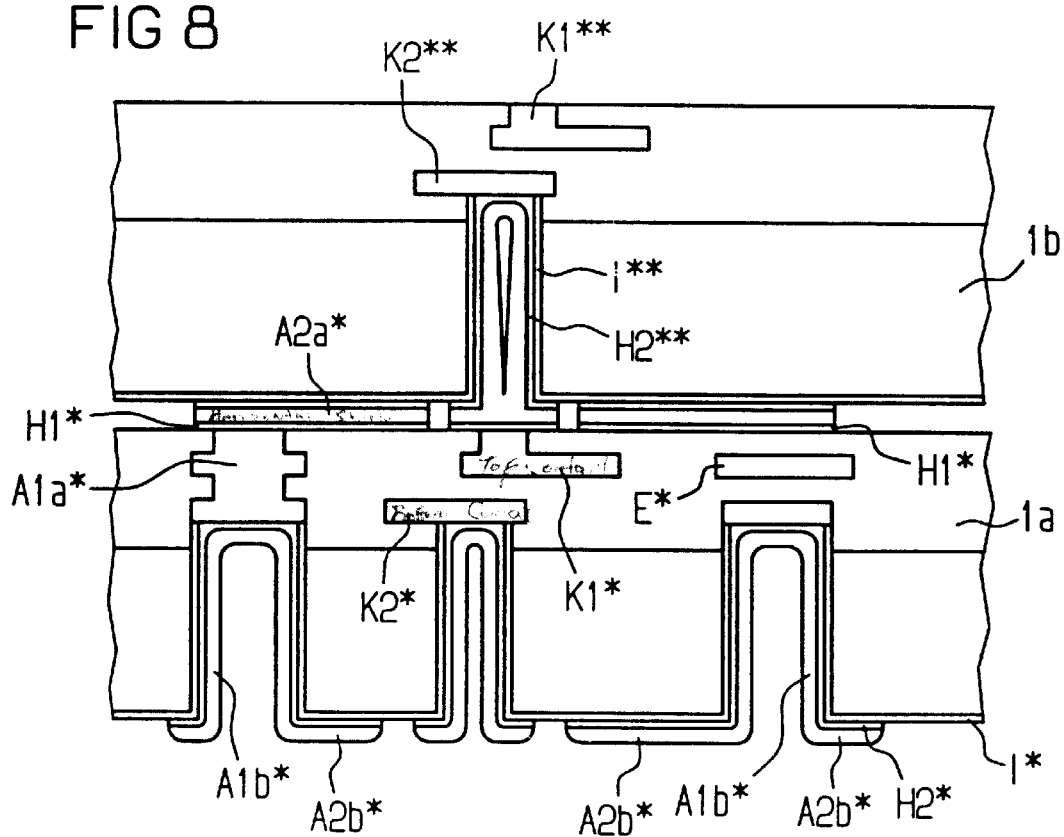

INTEGRATED CIRCUIT ARRANGEMENT WITH A NUMBER OF STRUCTURAL ELEMENTS AND METHOD FOR THE PRODUCTION THEREOF

In modern circuit designs, in order to increase packing density and shorten connection paths, power semiconductors are integrated on one chip together with their control logic. Examples of this are found in motor controls or in ABS circuits and airbag drives in the automotive field. It is necessary here to protect the sensitive drive logic from the interference of strong disturbing influences from the power semiconductor.

Previously, the drive logic of the power semiconductors was separated galvanically (cf. A. Nakagawa et al., ISPS 1990, p. 97 to 101). To this end, the modules were integrated on silicon wafers comprising a thin $SiO_2$ layer beneath the active Si region. The galvanic separation was obtained by etching trenches around the circuits, said trenches extending to the insulating $SiO_2$ layer.

The thus obtained shielding of the drive logic against interference is inadequate against high-frequency disturbing impulses, however. Rapid switching processes can trigger an uncontrolled responding of the logic.

U.S. Pat. No. 5,306,942 teaches an integrated circuit arrangement with at least one structural element that is delegated in a first substrate, which element is shielded by a shielding structure from electrical fluctuations of the first substrate caused by another structural element of the circuit arrangement. To this end, a shielding structure is created which surrounds a bottom half of the structural element laterally and comprises a bottom horizontal shielding element. To generate such an integrated circuit arrangement, a method is described in which an annular depression is created in a surface of a substrate. An insulating layer and a layer of polysilicon are subsequently deposited. A thick layer of $SiO_2$ is deposited on this and planarized. On the planarized surface of the $SiO_2$ layer, a second substrate is deposited as a carrier. The rear side of the first substrate is then ground thin, until the insulating layer is exposed. Parts of the conductive layer serve as a shielding structure. In a part of the first substrate that is surrounded by the shielding structure, source/drain regions are created by implantation. A gate electrode and contacts are created over these. Since high temperatures are required in order to deposit the carrier and to create the source/drain regions, doped polysilicon, which has a high melting point, is used for the shielding structure.

Japanese Patent Application No. 61/290 753 demonstrates an integrated circuit arrangement in which a lateral metallic structure is arranged next to a structural element. To this end, depressions which are lined with an insulating layer and filled with conductive material are arranged in a surface of a substrate at which the structural element adjoins.

European Patent Application No. 0 567 694 describes an integrated circuit arrangement with at least two blocks, which are separated from one another by an insulating layer. A metallic plate is arranged between them, in order to limit the capacitive coupling between the first and second blocks.

U.S. Pat. No. 5,122,856 describes a circuit arrangement which is integrated in a substrate, which arrangement can switch electrical signals from a surface of the substrate to a rear side of the substrate. To this end, depressions are made in the rear side of the substrate, which are lined with an insulating layer. A contact element extends along a sidewall of the depression. Stacks comprising structural elements can be arranged on top of each other in that electrodes of the structural elements are connected to one another by heating.

U.S. Pat. No. 5,266,511 describes a three-dimensional integrated circuit arrangement in which substrates comprising structural elements are stacked on top of one another. The structural elements are arranged in monocrystalline layers. The connecting of the substrates is accomplished by heating two adjacent $SiO_2$ layers of the substrates to approximately 900° C. Structural elements that are stacked on top of one other are electrically connected to one another other by contacts

SUMMARY OF THE INVENTION

It is an object of the present invention to provide an integrated circuit arrangement in which structural elements are shielded against interference, even high-frequency disturbing impulses, and a method for the production thereof.

This object is inventively achieved in accordance with the invention by a metallic shielding structure that acts as a Faraday cage, which structure surrounds the structural element to be protected, and in a method for the production therof.

The term "structural element" is used here for individual elements such as diodes and transistors as well as for circuit structures comprising a number of elements.

Protecting structural elements with a metallic shielding structure brings the advantage of avoiding the high costs associated with the use of the above described wafers containing $SiO_2$.

By the metallic shielding structure, the structural elements are protected from interfering impulses not only of neighboring power semiconductors, but of any origin. The necessity for an additional shielding against interfering impulses from the environment is forgone. This keeps the volume of the chip particularly small.

The structural elements can be integrated into a three-dimensional circuit arrangement. Substrates comprising structural elements are thus joined on top of each other in a stacked fashion. Compared to the common two-dimensional arrangement, which is conditional to the use of a common substrate material for all modules, the three-dimensional arrangement increases the combinatorial possibilities with regard to the material and production process of the various structural elements. Sensor elements or high-speed GaAs-Hf transistors can thus be combined with silicon CMOS logic, for example.

To produce one part of the shielding structure, the surfaces of the structural elements are provided with a metallic layer, and their electrical contacts are subsequently electrically insulated from the metallic layer by etching away the metallic layer around the contacts. It is advantageous to use two different metals for the metallic layers of two structural elements that are arranged adjacently in the stack, the alloy of which has a melting point above the melting point of at least one metal. If the structural elements are now brought together, and their metallic layers are heated to a temperature below the melting point of the alloy, at which one metal is solid and the other liquid, then the metals mix, which results in a hardening, due to the higher melting point of the alloy. The metals of the shielding structure thereby simultaneously serve to permanently connect two adjacent structural elements in the stack.

It is advantageous to use tin as one metal, since it has a low melting point. Copper can be chosen as the other metal.

It is advantageous to deposit an auxiliary layer made of Ti or TiN prior to applying the metals onto the surface, which layer improves the adhesion of the metallic layer and forms a barrier against diffusion of the metals into metallic parts of the surface of the structural elements.

It is advantageous to apply an additional auxiliary layer of copper prior to the application of the tin, in order to improve the adhesion further.

These and other features of the invention(s) will become clearer with reference to the following detailed description of the presently preferred embodiments and accompanied drawings.

FIG. 1 is a cross-section through a first substrate, in whose top layer there is a structural element with a top and a bottom contact, and with an electrical connection, this being surrounded by a first lateral shielding element in the top layer, which is interrupted for purposes of leading the electrical connection through.

FIG. 2 is a cross-section through the first substrate of FIG. 1, on whose top surface an auxiliary layer and a top horizontal shielding element is deposited.

FIG. 3 is a cross-section through a second substrate, in whose top layer there is a structural element with a top and a bottom contact and with an electrical connection, this being, surrounded by a depression in the top layer, which is interrupted for purposes of leading the electrical connection through.

FIG. 4 is a cross-section through the second substrate of FIG. 3, on whose top surface an auxiliary layer is deposited and a top horizontal shielding element and a first lateral shielding element are created.

FIG. 5 is a cross-section through a third substrate, in whose top layer there is a structural element with a top and a bottom contact and with an electrical connection, this being surrounded by a depression that is provided with an insulating layer.

FIG. 6 is a cross-section through the first substrate of FIG. 2, which is ground thin from below and in which depressions are created on its bottom surface, which depressions encounter the first lateral shielding element in the top layer, on one hand, and the bottom contact of the structural element, on the other hand. The sidewalls of the depressions and the bottom surface of the substrate are provided with an insulating layer.

FIG. 7 is a cross-section through the first substrate of FIG. 6 subsequent to the deposition of an auxiliary layer and of a bottom shielding element onto the bottom surface.

FIG. 8 is a cross-section through two substrates arranged one on top of the other and which are connected.

DETAILED DESCRIPTION OF THE PRESENTLY PREFERRED EMBODIMENTS

Referring to FIG. 1, in a first embodiment, a first substrate 1, such as an unthinned semiconductor wafer consisting of monocrystalline silicon or of a III-V semiconductor, comprises one or more structural elements. In its top layer, a structural element of the first substrate 1 contains a transistor or a circuit structure consisting of a number of metal and/or semiconductor layers embedded in an insulating environment, which can contain intermetallic oxides, for example (not illustrated in detail). The region of the circuit structure is referenced S. The structural element comprises electrical contacts and connections. FIG. 1 depicts a top contact K1, a bottom contact K2 and an electrical connection E. If the structural element should be shielded, then a first lateral shielding element A1a made of metal surrounds the region of the circuit structure S. It is interrupted at the location of the electrical connection E so as to avoid an electrical contact from the first lateral shielding element A1a to the electrical connection E. The first lateral shielding element A1a is created at the same time as the circuit structure and thus consists of the same metal as the metallic parts of the circuit structure.

Referring to FIG. 2, a top auxiliary layer H1 is deposited on a surface of the substrate 1, and on top of this a metallic top horizontal shielding element A2a. To this end, a first layer is initially created by sputtering. The first layer consists of a material such as Ti or TiN which facilitates the wetting of the surface with metal and which is 100 nm thick, for example. A second layer made of metal is subsequently deposited over the first layer by sputtering or evaporation with an electron beam. The second layer contains copper, tin, gallium, nickel, or tungsten, and is 1–2 $\mu$m thick, for example. By anisotropic etching with the aid of a mask made of photosensitive resist (not illustrated), parts of the first and second layer that do not cover the structural element are removed, on one hand, and the contact K1 is electrically insulated, on the other hand. The top auxiliary layer H1 and the top horizontal shielding element A2a thus emerge. Given the use of a metal of the second layer that wets the surface effectively without the top auxiliary layer H1, it is possible to forgo the top auxiliary layer H1. Given the use of tin, an additional auxiliary layer can be deposited, for instance a copper layer 20 nm thick which is formed like the top auxiliary layer H1 and which is located above the top auxiliary layer H1.

Referring to FIG. 3, in a second embodiment, a substrate 1' comprises at least one structural element, a top contact K1', a bottom contact K2', and an electrical connection E' are provided, analogously to the first exemplifying embodiment. A mask (not illustrated) made of photosensitive resist is deposited on the substrate 1'. The mask made of photosensitive resist is used as an etching mask in an anisotropic etching for purposes of creating a depression V', for instance a plasma etching. The depression V' surrounds the structural element laterally. Above the electrical connection E', the depression V' comprises an interruption U. In the framework of the invention, the depression V' may also be extended above the electrical connection E', whereby the bottom of the depression V' at this point does not reach the electrical connection E', so that insulating material completely surrounds the electrical connection E' (this is not illustrated).

Referring to FIG. 4, on a surface of the substrate 1', a top auxiliary layer H1' is deposited, and on top of this a metallic top horizontal shielding element A2a' and a first lateral shielding element A1a'. To this end, a first layer and a second layer are created, as in the first embodiment. By anisotropic etching with the aid of a mask made of photosensitive resist (not illustrated), parts of the first and second layers, which do not cover the structural element, are removed, on one hand, and the contact K1' is electrically insulated, on the other hand. The top auxiliary layer H1', the top horizontal shielding element A2a', and the first lateral shielding element A1a', thereby emerge.

Referring to FIG. 5, in a third exemplifying embodiment, a substrate 1" comprising at least one structural element, a top contact K1", a bottom contact K2", and an electrical connection E" are provided, as in the first and second embodiments. A mask made of photosensitive resist is used as an etching mask in an anisotropic etching, for instance a plasma etching, for purposes of creating a depression V". The depression V" surrounds the structural element laterally and extends above the electrical connection E" up to the electrical connections E" which prevents a deeper etching and thus acts as an etching stop. Subsequent to the creation of the depression V", an insulating layer is deposited on the surface and structured by anisotropic etching with the aid of a mask made of photosensitive resist (not illustrated). An insulation 2 is thus created, which covers the sidewalls of the depression V" and surfaces of the electrical connection E".

A procedure analogous to that in the second embodiment is then followed for purposes of creating a top auxiliary layer H1", a top horizontal shielding element A2a" and a first lateral shielding element A1a' (not shwon).

Referring to FIG. 6, in the context of the first embodiment of the invention, subsequent to producing the top horizontal shielding element A2a on a top surface of the substrate 1, a carrier may be cemented on, whereupon a bottom side of the substrate 1 may be ground thin. Insulating material such as $SiO_2$ is deposited on a resultant bottom surface of the substrate 1 by means of sputtering, so as to cover the bottom surface completely. A mask made of photosensitive resist (not illustrated) is then deposited on the bottom surface. The photosensitive resist mask is used as an etching mask in an anisotropic etching such as a plasma etching for purposes of creating a depression V1, or respectively, V2. The depression V1 is made so as to encounter the first lateral shielding element A2a from below. The depression V2 extends up to the bottom contact K2. Insulating material such as $SiO_2$ is deposited surface-wide by sputtering, the bottom surface a being more densely covered by insulating material than side surfaces and floors of the depression V1 and of the depression V2. The insulating material at the floors of the depression V1 and the depression V2 is then removed by anisotropic etching, producing an insulation I that covers the depressions V1 and V2 only at the sidewalls and at the bottom surface.

Referring to FIG. 7, subsequently a bottom auxiliary layer H2 is deposited on the bottom side of the substrate 1, and on this a metallic second lateral shielding element A1b and a bottom horizontal shielding element A2b. To this end, a third layer is created by sputtering. The third layer consists of a material such as Ti or TiN which facilitates the wetting of the surface with metal and is 100 nm thick, for example. A fourth metallic layer is then deposited over the third layer by sputtering or evaporation with an electron beam. The fourth layer contains copper, tin, gallium, nickel or tungsten and is 1–2 $\mu$m thick, for example. With the aid of a photosensitive resist layer (not illustrated), by means of anisotropic etching, parts of the third and fourth layers not covering the structural element are removed, on one hand, and the bottom contact K2 is electrically insulated, on the other hand. Besides the bottom auxiliary layer H2, the bottom horizontal shielding element A2b and the second lateral shielding element A1b thereby emerge, which produce a shielding structure for the structural element in conjunction with the top horizontal shielding element A2a and the first lateral shielding element A1a. Given the use of a metal of the fourth layer which wets the surface of the insulation I effectively, the auxiliary layer H2 can be forgone. Given the use of tin, an additional auxiliary layer can be deposited which contains copper 20 nm thick, for example, and which is located over the bottom auxiliary layer H2, this being formed like the auxiliary layer H2. It is advantageous to cover the depression V1 (FIG. 6) by an insulating 1 layer only at the sidewalls, since this results in an electrical contact between the first lateral shielding element A1a and the second lateral shielding element A1b, thereby guaranteeing a uniform voltage potential of the shielding structure. Further embodiments derive from the second embodiment on the basis of an analogous method at substrate 1', and from the third embodiment, at substrate 1".

Referring to FIG. 8, to produce a three-dimensional circuit arrangement, in an embodiment two substrates 1a and 1b are arranged one on top of the other. Substrate 1a comprises a top electrical contact K1*, a bottom electrical contact K2*, an electrical connection E*, a first lateral shielding element A1a*, a second lateral shielding element A1b*, a top horizontal shielding element A2a*, a bottom horizonatal shielding element A2b*, an insulation I*, a top auxiliary layer H1*, and a bottom auxiliary layer H2*, analogous to the third embodiment illustrated in FIG. 7. The substrate 1b comprises a top electrical contact K1, a bottom electrical contact K2, an electrical connection E**, an insulation * and a bottom auxiliary layer H2, analogously to the third embodiment illustrated in FIG. 7. A metallic layer (not illustrated) covers the auxiliary layer H2. The substrates are arranged such that the contact K2** is electrically connected to the contact K1*. The metallic layer and the top horizontal shielding element A2a are soldered together, the substrates 1a and 1b being permanently connected in this way.

It is advantageous to choose different metals for the metal of the metallic layer and for the metal of the top shielding element A2a, the alloy of which has a high melting point lying above the melting point of at least one metal. The connection of the substrates 1a and 1b is then accomplished by heating to a temperature below the melting point of the alloy, at which one metal is solid and the other is liquid, whereby the metals mix, resulting in a hardening due to the higher melting point of the alloy. The metal of the top horizontal shielding element A2a* thus simultaneously serves to permanently connect the substrates 1a and 1b.

In an embodiment, the bottom side of the substrate 1a may be connected to the bottom side of the substrate 1b, or the top side of the substrate 1a may be connected to the top side of the substrate 1b. In the latter case, it is advantageous to provide the top side of the substrate 1b with a metallic layer which encounters the top horizontal shielding structure A2a* in the joining of the substrates 1a and 1b.

In an embodiment, more than two substrates may be connected into a stack.

In an embodiment, at least one unthinned substrate such as that from FIG. 1 or FIG. 2 may be incorporated into the stack.

In the context of the invention, the connecting of different substrates may be accomplished by other methods, such as via adhesive layers according to Y. Hayashi et al, Symp. on VLSU Technl (1990), page 95 to 96.

Although modifications and changes may be suggested by those of ordinary skill in the art, it is the intention of the inventors to embody within the patent warranted hereon all changes and modifications as reasonably and properly come within the scope of their contribution to the art.

What is claimed is:

1. An integrated circuit arrangement including a number of structural elements having a number of contacts and a number of electrical connections, said integrated circuit arrangement comprising:
   a substrate made of a semiconductor material and having a top layer, said structural elements being arranged in said top layer; and
   a metallic shielding structure surrounding at least one of said structural elements, said shielding structure including a number of lateral shielding elements for shielding at least a side of said structural element, a top shielding element for shielding a top of said structural element, and a bottom shielding element for shielding a bottom of said structural element, said lateral shielding elements being arranged at least partially in said substrate and being separated from said substrate by an insulation.

2. The integrated circuit arrangement as claimed in claim 1, wherein said shielding structure completely surrounds said structural element up to regions that surround said contacts and said electrical connections of said structural element.

3. The integrated circuit arrangement as claimed in claim 1, wherein at least one of said structural elements is selected from the group consisting of bipolar transistors, GaAs transistors, HEMT, MESFET, HBT, thyristors, CMOS logic, bipolar logic, and ECL.

4. The integrated circuit arrangement as claimed in claim 1, wherein said structural elements are arranged next to and beneath one another.

5. The integrated circuit arrangement as claimed in claim 4,
wherein said substrate further comprises a number of substrates including a number of structural elements, said number of substrates being arranged on top of each other in a stack; and
wherein each of said structural elements is surrounded by a shielding structure and is separated from said shielding structure by an insulating layer, said shielding structure having lateral shielding elements inside a respective substrate and horizontal shielding elements between adjacent substrates, said lateral shielding elements and said horizontal shielding elements being interrupted by insulating regions, said insulating regions including regions surrounding said contacts and said electrical connections of said structural elements.

6. The integrated circuit arrangement as claimed in claim 5, wherein said horizontal shielding elements and parts of said contacts of said structural elements contained in said substrates are located an adjacent surfaces of said stacked substrates.

7. The integrated circuit arrangement as claimed in claim 5, wherein said insulating regions surrounding said electrical connections between structural elements of a substrate contain intermetallic oxides.

8. The integrated circuit arrangement as claimed in claim 5, wherein said insulating regions surrounding said contacts between structural elements of different substrates are holes.

9. The integrated circuit arrangement as claimed in claim 6,
wherein said structural elements being mutually insulated by intermetallic oxides are adjacent at one surface of each of said substrates; and
wherein a layer of a first substrate is adjacent a surface of a second substrate, said layer being separated from said surface of said second substrate by an insulating layer when said layer is not insulating.

10. The integrated circuit arrangement as claimed in claim 5, wherein said lateral shielding elements contain an alloy of a first metallic component and a second metallic component, said first metallic component being solid at a processing temperature and dissolving into said second metallic component being a liquid at said processing temperature, resulting in a hardening of mixed first and second metallic components.

11. The integrated circuit arrangement as claimed in claim 5, wherein at least one horizontal shielding element of a first substrate comprises a first metallic component, and at least one contact of a second substrate adjacent said first substrate comprises a second metallic component, one of said first and second metallic components being a solid and dissolving into another of said first and second metallic components being a liquid at a processing temperature and thereby hardening for forming a permanent connection between said first substrate and said second substrate.

12. A method for the production of an integrated circuit arrangement including a number of structural elements having a number of first contact, a number of second contacts and a number of electrical connections, the method comprising the steps of:
creating a number of structural elements in a top layer of a substrate made of semiconductor material;
forming an insulation on said substrate; and
surrounding at least one of said structural elements with a metallic shielding structure by creating a number of top and bottom lateral shielding elements, a top horizontal shielding element, and a bottom horizontal shielding element, said lateral shielding elements being created at least partially in said substrate and being separated from said substrate by said insulation.

13. The method as claimed in claim 12, wherein said shielding structure completely surrounds said structural element, up to regions surrounding said first contacts, said second contacts and said electrical connections.

14. The method as claimed in claim 12, further comprising the steps of:
coating a top surface of said substrate with a metallic layer;
wherein said top horizontal shielding element is created from said metallic layer by etching around contact surfaces of said first contacts to insulate said first contacts from said metallic layer;
cementing said top surface of said substrate onto a carrier;
grinding thin said substrate from a bottom surface of said substrate;
creating first depressions and second depressions on said bottom surface of said substrate, said second depressions extending to said second contacts included in said substrate;
providing an insulation on said bottom surface of said substrate and on sidewalls of said first depressions and said second depressions;
coating said first depressions, said second depressions and said bottom surface of said substrate with metal, said metal coating of said second depressions providing a conductor from said second contacts to said bottom surface of said substrate, said metal coating of said first depressions creating metallic layers that completely surround said structural elements laterally, up to interruptions and thereby creating a bottom lateral shielding element;
forming interruptions of said metallic layers of said top and bottom lateral shielding elements at least in regions of said electrical connections for preventing an electrical contact between said metallic layers and said electrical connections; and
etching away said metal on said bottom surface of said substrate around contacts surfaces of said second contacts to a such a depth that insulating regions of said substrate are obtained.

15. The method as claimed in claim 14, further comprising the step of:
prior to coating said top surface of said substrate with a metallic layer, creating a number of first and second top depressions in said top surface of said substrate.

16. The method as claimed in claim 15, wherein said first top depression is created to laterally surround a structural element, said first top depression is interrupted over an electrical connections of said structural element, said first top depression does not reach conductive regions of said substrate; and wherein said first depression is created to contact said first top depression.

17. The method as claimed in claim 15, wherein said second top depression laterally surrounds a structural element, said second top depression extends to an electrical connection of said structural element from above said electrical connection, said second top depression has an insulating layer; and wherein said first depression is created to contact said second top depression.

18. The method as claimed in claim 15, further comprising the step of:

prior to coating said first and second depressions and said second top depression with metal, and prior to coating said top and bottom surfaces of said substrate with metal, applying an additional layer at said locations at which said metal is subsequently deposited, said additional layer improving adhesion of said metal and preventing diffusion of said metal into said first and second contacts.

19. The method as claimed in claim 14, further comprising the step of:

permanently connecting a number of said substrates into a stack, said second depression and said first contacts of said substrates being arranged such that second depressions and first contacts of one substrate encounter allocated second depressions and first contacts of an adjacent substrate.

20. The method as claimed in claim 19, wherein metals coated on surfaces of adjacent stacked substrates are different, and an alloy of said different metals on surfaces of two adjacent substrates comprises a melting point above a melting point of at least one of said metals; and wherein said adjacent substrates as connected by heating to a temperature below a melting point of said alloy, at which temperature one metal is solid and the other is liquid, said metals thereby mixing, resulting in a hardening due to said higher melting point of said alloy.

* * * * *